United States Patent
Sato

(10) Patent No.: US 11,056,729 B2
(45) Date of Patent: Jul. 6, 2021

(54) VEHICULAR BATTERY MONITORING SYSTEM

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Shinichiro Sato, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 229 days.

(21) Appl. No.: 16/348,619

(22) PCT Filed: Oct. 30, 2017

(86) PCT No.: PCT/JP2017/039068
§ 371 (c)(1),
(2) Date: May 9, 2019

(87) PCT Pub. No.: WO2018/092562
PCT Pub. Date: May 24, 2018

(65) Prior Publication Data
US 2020/0076013 A1    Mar. 5, 2020

(30) Foreign Application Priority Data
Nov. 17, 2016  (JP) .............................. JP2016-223765

(51) Int. Cl.
*H01M 10/48*  (2006.01)
*H04W 4/38*   (2018.01)
(Continued)

(52) U.S. Cl.
CPC .......... *H01M 10/48* (2013.01); *G01R 31/371* (2019.01); *G01R 31/3835* (2019.01);
(Continued)

(58) Field of Classification Search
CPC .... H01M 10/48; H01M 10/425; H01M 10/44; H01M 2010/4271; H01M 2010/4278;
(Continued)

(56) References Cited

U.S. PATENT DOCUMENTS

| | | | |
|---|---|---|---|
| 2010/0019732 A1* | 1/2010 | Utsumi ............. | H01M 10/4207 320/136 |
| 2016/0006085 A1* | 1/2016 | Toya ..................... | H02J 7/0021 429/90 |
| 2018/0017631 A1* | 1/2018 | Kudo ..................... | G01R 19/00 |

FOREIGN PATENT DOCUMENTS

| | | |
|---|---|---|
| JP | 2012-222913 A | 11/2012 |
| JP | 2015-079585 A | 4/2015 |

OTHER PUBLICATIONS

International Search Report, Application No. PCT/JP2017/039068, dated Nov. 21, 2017. ISA/Japan Patent Office.

* cited by examiner

*Primary Examiner* — Nathaniel R Pelton
(74) *Attorney, Agent, or Firm* — Honigman LLP

(57) ABSTRACT

Realized is a vehicular battery monitoring device or a vehicular battery monitoring system for which the number of wires can be reduced, and that can transmit information using a characteristic transmission path. A battery monitoring device includes: a detection unit configured to detect at least one of a voltage at a predetermined position of a battery or a temperature of the battery; and a wireless communication unit configured to transmit, using a wireless communication method, detection information that indicates at least one of the voltage and the temperature of the battery based (Continued)

on a detection result of the detection unit, at least to another battery monitoring device provided in a vehicle.

7 Claims, 8 Drawing Sheets

(51) Int. Cl.
    *G01R 31/3835*     (2019.01)
    *G01R 31/371*     (2019.01)
    *H01M 10/42*     (2006.01)
    *H01M 10/44*     (2006.01)
    *H02J 7/00*     (2006.01)

(52) U.S. Cl.
    CPC ......... *H01M 10/425* (2013.01); *H01M 10/44* (2013.01); *H02J 7/0016* (2013.01); *H02J 7/0021* (2013.01); *H04W 4/38* (2018.02); *H01M 2010/4271* (2013.01); *H01M 2010/4278* (2013.01); *H01M 2220/20* (2013.01)

(58) Field of Classification Search
    CPC ........... H01M 2220/20; G01R 31/3835; G01R 31/371; H02J 7/0016; H02J 7/0021; H04W 4/38
    USPC ......................................................... 320/118
    See application file for complete search history.

FIG. 3
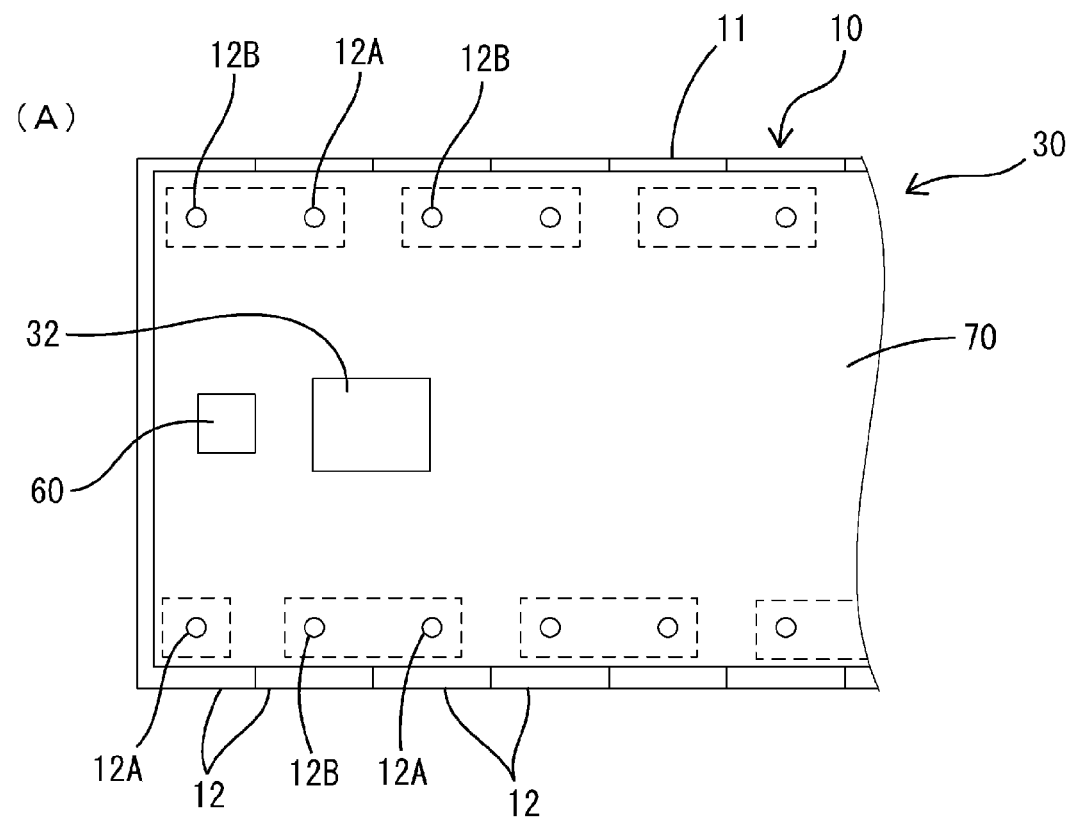
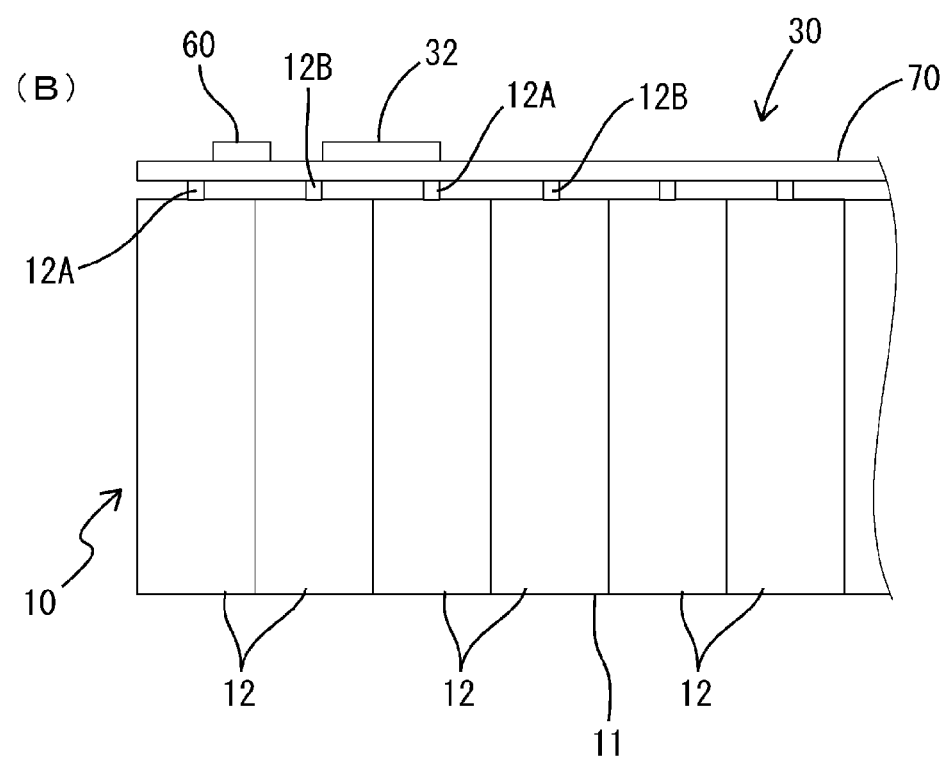

VEHICULAR BATTERY MONITORING SYSTEM

CROSS-REFERENCE TO RELATED APPLICATIONS

This application is the U.S. national stage of PCT/JP2017/039068 filed on Oct. 30, 2017, which claims priority of Japanese Patent Application No. JP2016-223765 filed on Nov. 17, 2016 the contents of which are incorporated herein.

TECHNICAL FIELD

The present disclosure relates to a vehicular battery monitoring system.

BACKGROUND

Conventionally, a technique for monitoring a plurality of cells that constitute a battery using a battery monitoring device has been provided. For example, JP2015-79585A discloses a battery monitoring device provided with satellite substrates (circuit boards) that respectively correspond to a plurality of assembled batteries, each satellite substrate being provided with a monitoring IC for monitoring voltages across the cells of the corresponding assembled battery. Also, the plurality of satellite substrates are connected to each other via a coupling wire, and one of the satellite substrates is connected to a main substrate via a connecting wire.

However, since the battery monitoring device disclosed in JP2015-79585A requires the coupling wire, which couples the satellite substrates with each other, and the connecting wire, which couples the satellite substrate and the main substrate, resulting in an increase in the number of wires, which may cause the problem that the battery monitoring device is heavy and large. Moreover, there is also the problem that, due to the increase in the number of wires, the wiring design is complicated.

The present disclosure was made in view of the aforementioned circumstances, and it is an object thereof to provide a vehicular battery monitoring system for which the number of wires can be reduced and that can transmit information using a characteristic transmission path.

SUMMARY

According to an example of the present disclosure, a vehicular battery monitoring system includes: three or more vehicular battery monitoring devices for monitoring a battery installed in a vehicle; and an external control device configured to receive information transmitted from any one of the plurality of battery monitoring devices. Each of the vehicular battery monitoring devices includes: a detection unit configured to detect at least one of a voltage at a predetermined position of the battery and a temperature of the battery; and a wireless communication unit configured to transmit, using a wireless communication method, detection information that indicates at least one of the voltage and the temperature of the battery based on a detection result of the detection unit, at least to another battery monitoring device provided in the vehicle. The external control device is configured to receive information transmitted from the wireless communication unit of any one of the plurality of battery monitoring devices, one of these battery monitoring devices is defined as a topmost monitoring device at the highest rank, another device is defined as a lowermost monitoring device at the lowest rank, and any monitoring device other than the topmost monitoring device and the lowermost monitoring device is defined as an intermediate monitoring device. If a predetermined transmission condition is met, the topmost monitoring device is configured to take the battery monitoring device at the next lower rank as a destination, and wirelessly transmit wireless transmission data that contains the detection information generated by the topmost monitoring device to this destination. Any intermediate monitoring device is configured to, if wireless transmission data is given to it through wireless transmission from the battery monitoring device at the next higher rank, transmit new wireless transmission data obtained by adding the detection information generated by itself to the given wireless transmission data, to the battery monitoring device at the next lower rank. The lowermost monitoring device is configured to, if wireless transmission data is given to it through wireless transmission from the battery monitoring device at the next higher rank, wirelessly transmit new wireless transmission data obtained by adding the detection information generated by itself to the given wireless transmission data, to the external control device. The external control device is configured to wirelessly transmit instruction information that specifies a predetermined instruction to the lowermost monitoring device, if data that contains the instruction specified by the instruction information is given through wireless transmission from the external control device, the lowermost monitoring device is configured to take the battery monitoring device at the next higher rank as a destination, and wirelessly transmit the data that contains the instruction specified by the instruction information to this destination. Any intermediate monitoring device is configured to, if data that contains the instruction specified by the instruction information is given to it through wireless transmission from the battery monitoring device at the next lower rank, take the battery monitoring device at the next higher rank as a destination, and wirelessly transmit the data that contains the instruction specified by the instruction information to this destination. Upon receiving the data that contains the instruction specified by the instruction information, each of the plurality of battery monitoring devices performs control that corresponds to the instruction specified by the instruction information, and if no communication is established despite a trial of communication with the lowermost monitoring device, the external control device takes the battery monitoring device at the lowest rank of the plurality of battery monitoring devices excluding the lowermost monitoring device as a destination, and transmits the instruction information to this destination.

Advantageous Effects of Disclosure

Since in the above-described battery monitoring system, the battery monitoring device can transmit detection information (information that indicates at least one of a voltage or a temperature of the battery) based on a detection result of the detection unit to another battery monitoring device, transmission of the detection information using another battery monitoring device is possible. Moreover, the characteristic information transmission using another battery monitoring device in this way can be realized by wireless communication, and thus it is possible to effectively reduce the number of wires.

Furthermore, it is possible to realize a system that can transmit detection information based on detection results in the battery monitoring devices (information indicating at least one of the voltage or the temperature of the battery) to the external control device via communication, with a configuration in which the number of wires is reliably reduced.

Furthermore, it is possible to define the order of transmission of information among a plurality of battery monitoring systems. Also, when the detection information generated by the plurality of battery monitoring devices are output to the outside, the detection information generated by the battery monitoring devices can be collected in the order starting from the topmost monitoring device, and the collected data can be wirelessly transmitted from the lowermost monitoring device to the external control device. When employing such a method, it is possible to perform communication between battery monitoring devices and communication from the lowermost monitoring device to the external control device via wireless communication, and thus the effect of reducing the number of wires can be significantly enhanced. Moreover, since detection information can be collected at the lowermost monitoring device, and then can be transmitted from the lowermost monitoring device to the external control device, making it possible to reduce the load applied to the external control device compared to a configuration in which the external control device always communicates with all of the battery monitoring devices.

Moreover, it is possible to realize a battery monitoring system in which each of the plurality of battery monitoring devices can perform control that corresponds to an instruction from the external control device, with a configuration in which the number of wires can be reduced and the communication load applied to an external control device is suppressed.

BRIEF DESCRIPTION OF DRAWINGS

FIG. 3(A) is a plan view partially illustrating, in a simplified manner, a configuration in which a battery monitoring device of Embodiment 1 is attached to the battery, and FIG. 3(B) is a front view thereof.

DETAILED DESCRIPTION OF PREFERRED EMBODIMENTS

Figure 1:
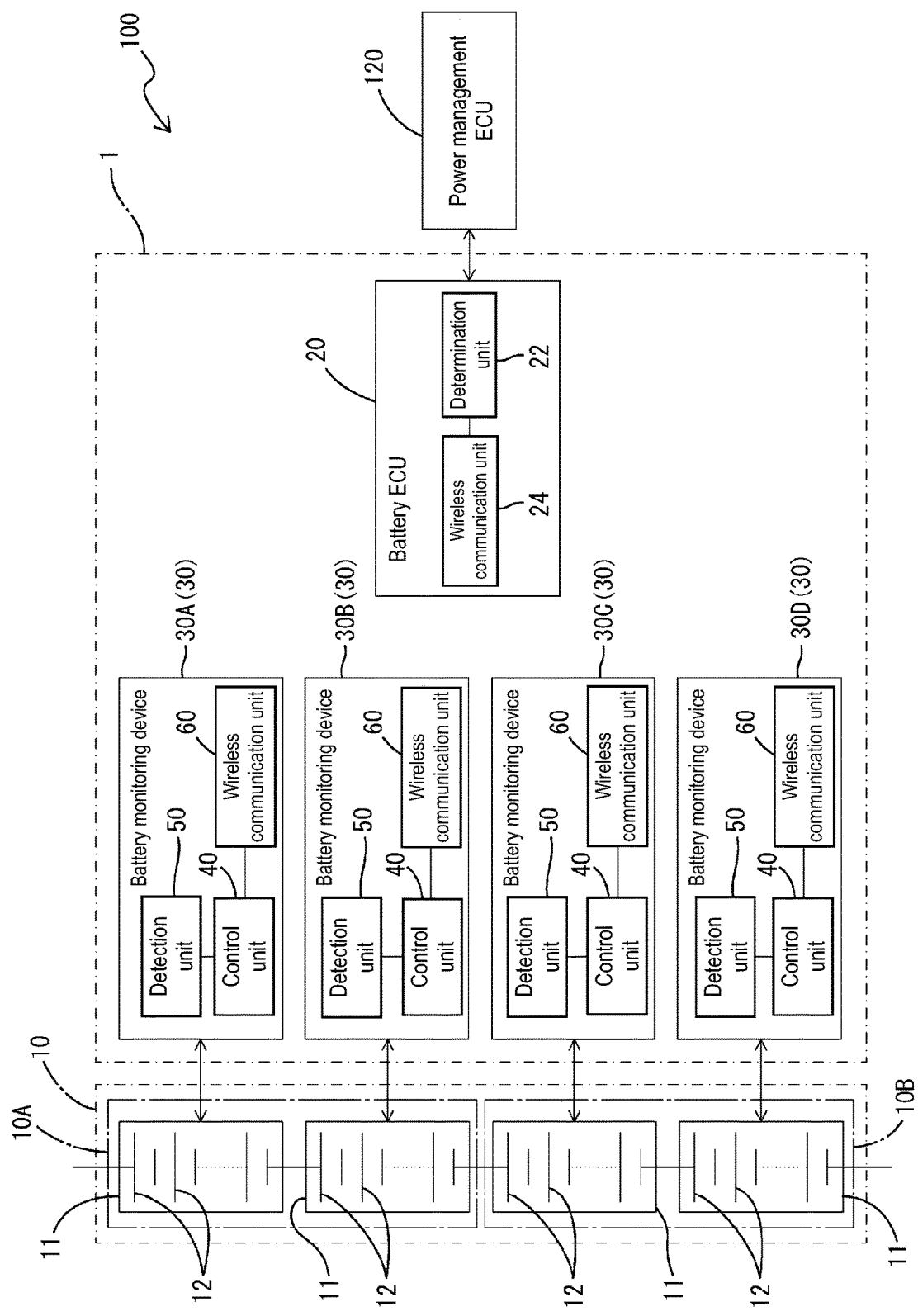
FIG. 1 is a block diagram schematically illustrating an example of an onboard power supply system provided with a battery monitoring system according to Embodiment 1.

The battery monitoring device may include a substrate portion configured to be attached to the battery directly or indirectly via another member. Also, at least the wireless communication unit may be mounted on the substrate portion.

According to the above-described configuration, since the substrate portion can be arranged in the vicinity of the battery, further downsizing is possible. Even if the substrate portion is arranged in the vicinity of the battery in this way, it is possible to wirelessly transmit information to the outside, and thus the wiring design is not likely to be complicated.

In the vehicular battery monitoring system, the external control device may function to wirelessly transmit the instruction information that contains a predetermined notification instruction to the lowermost monitoring device. Any intermediate monitoring device may function to, if data that contains a notification instruction is given to it through wireless transmission from the battery monitoring device at the next lower rank, take the battery monitoring device at the next higher rank as a destination, and wirelessly transmit the data that contains the notification instruction to this destination. The topmost monitoring device may function to, if the data that contains a notification instruction is given to it through wireless transmission from the battery monitoring device at the next lower rank, take the battery monitoring device at the next lower rank as a destination, and wirelessly transmit wireless transmission data that contains the detection information generated by the topmost monitoring device to this destination. Any intermediate monitoring device may function to, if the data that contains the notification instruction is given and wireless transmission data is given to it through wireless transmission from the battery monitoring device at the next higher rank, wirelessly transmit new wireless transmission data obtained by adding the detection information generated by itself to the given wireless transmission data, to the battery monitoring device at the next lower rank. The lowermost monitoring device may function to, if the data that contains the notification instruction is given through wireless transmission from the external control device and wireless transmission data is given to it through wireless transmission from the battery monitoring device at the next higher rank, wirelessly transmit new wireless transmission data obtained by adding the detection information generated by itself to the given wireless transmission data, to the external control device.

According to the above-described configuration, it is possible to realize a battery monitoring system in which each of the plurality of battery monitoring devices can transmit detection information (detection information indicating at least one of the voltage and temperature of the battery) in accordance with a notification instruction from the external control device, with a configuration in which the number of wires is reduced and the communication load applied to an external control device is suppressed.

The detection unit of the battery monitoring device may be configured to detect voltage information that specifies inter-terminal voltages of a plurality of battery cells, the plurality of battery cells being connected to each other to constitute the battery. The external control device may function to wirelessly transmit the instruction information that contains a predetermined cell balance instruction to the lowermost monitoring device. If data that contains the cell balance instruction is given through wireless transmission from the external control device, the lowermost monitoring device may function to take the battery monitoring device at the next higher rank as a destination, and wirelessly transmit the data that contains the cell balance instruction to this destination. Any intermediate monitoring device may function to, if data that contains the cell balance instruction is given to it through wireless transmission from the battery monitoring device at the next lower rank, take the battery monitoring device at the next higher rank as a destination, and wirelessly transmit the data that contains the cell balance instruction to this destination. Upon receiving data that contains the cell balance instruction, each of the battery monitoring devices may function to cause the plurality of battery cells to charge or discharge so that the inter-terminal voltages of the battery cells are equalized, based on detection results of the detection unit of the corresponding battery monitoring device.

According to the above-described configuration, it is possible to realize a battery monitoring system in which each of the plurality of battery monitoring devices can perform cell balance control in accordance with a cell balance instruction from the external control device, with a configuration in which the number of wires can be reduced and the communication load applied to an external control device is suppressed.

Embodiment 1

Hereinafter, Embodiment 1 of the present disclosure will be described.

First, the overview of an onboard power supply system 100, which is an application example of the present disclosure, will be described.

FIG. 1 shows the onboard power supply system 100 in a simplified manner. The onboard power supply system 100 shown in FIG. 1 is provided with a battery 10, a battery monitoring system 1 that monitors the battery 10, and a power management ECU 120 (Electric Control Unit) that can communicate with the battery monitoring system 1.

The battery 10 is, for example, a lithium-ion battery constituted by a plurality of battery cells 12, and is used as, for example, a power source that outputs electric power for driving an electromotive driving device (such as a motor) of a vehicle such as a hybrid vehicle or an electric vehicle (EV). The battery 10 is charged by a not-shown power-generating unit installed in the vehicle.

The battery 10 has a configuration in which a plurality of battery cells 12 configured as lithium-ion batteries are connected in series to each other to constitute one assembled battery 11, and a predetermined number of assembled batteries 11 are connected in series to each other to constitute one stack 10A, the stack 10A being housed in a case. Also, a plurality of thus-configured stacks 10A are connected in series to each other to constitute the battery 10 that can output a desired output voltage (for example, a few hundred V).

As shown in FIG. 1, the battery monitoring system 1 is provided with a plurality of battery monitoring devices 30, and a battery ECU 20 that serves as an external control device, and the battery monitoring system 1 has a configuration in which the plurality of battery monitoring devices 30 can wirelessly communicate with the battery ECU 20 (external control device). Each of the plurality of battery monitoring devices 30 is also configured to be able to wirelessly communicate with another battery monitoring device 30.

The following will describe the battery monitoring devices 30 in detail.

In the example of FIG. 1, one battery monitoring device 30 is assigned to one of the assembled batteries 11 constituting the battery 10. Each battery monitoring device 30 is provided with a detection unit 50 that detects the voltage or temperature of the assigned assembled battery 11, a control unit 40 that performs various types of control such as control that corresponds to an instruction from the outside, and a wireless communication unit 60 that wirelessly communicates with another battery monitoring device 30 or the battery ECU 20.

Figure 2:
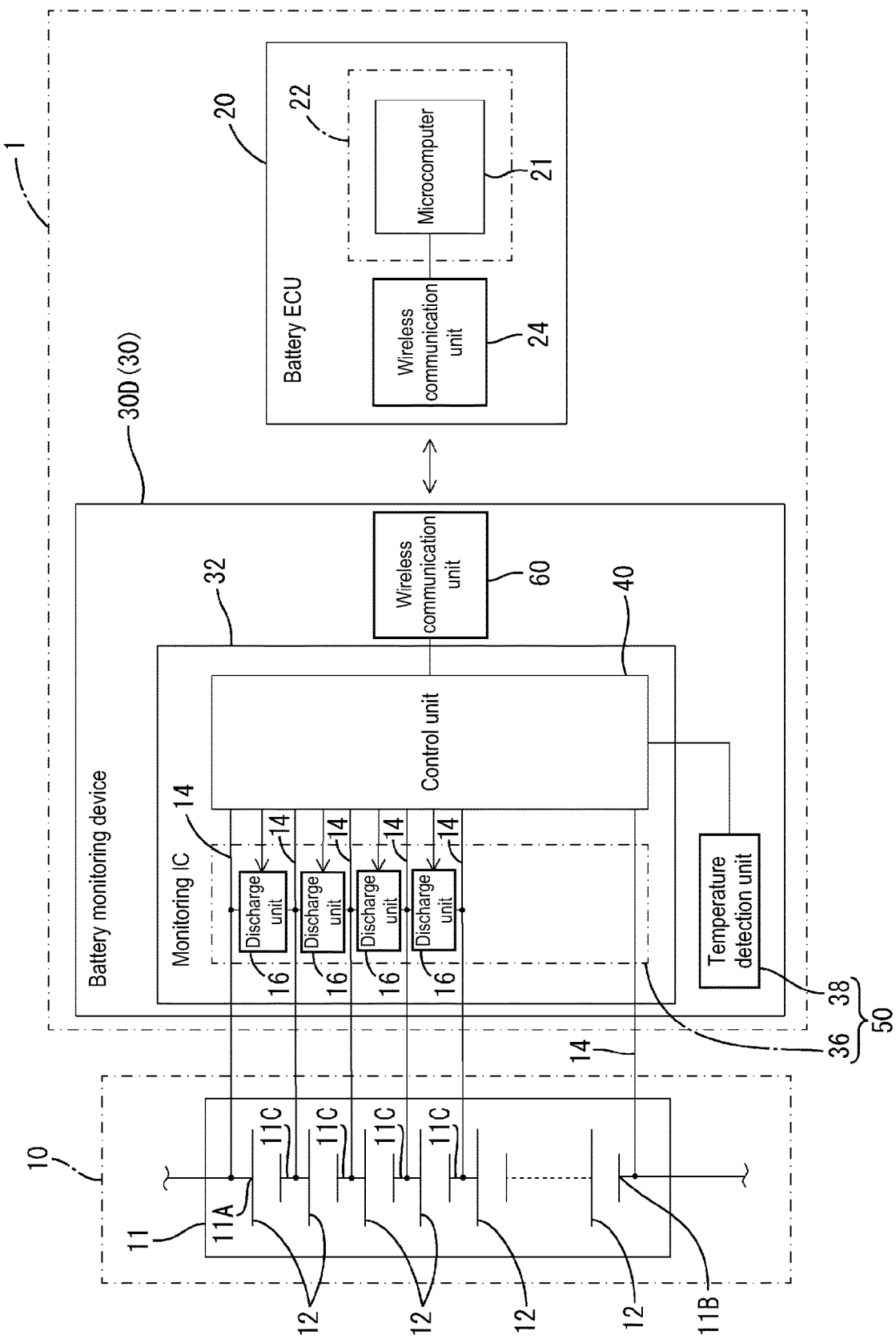
FIG. 2 is a block diagram specifically illustrating part of the battery monitoring system of Embodiment 1 and a battery.

The control unit 40 shown in FIGS. 1 and 2 is made of a microcomputer or another hardware circuit, and may be configured to be able to perform, at least when the wireless communication unit 60 receives an instruction from the outside, control that corresponds to this instruction. In the present configuration, the control unit 40 and a detection/adjustment circuit unit 36 are integrated into a monitoring IC 32, for example. Note that FIG. 2 schematically shows a hardware configuration of the lowermost monitoring device 30D, of the plurality of battery monitoring devices 30, but other battery monitoring devices 30 have the same hardware configuration as that of the lowermost monitoring device 30D.

In the example shown in FIG. 2, the control unit 40 is configured as a microcomputer that includes a CPU, a ROM, a RAM, and the like, and, for example, if a predetermined notification instruction transmitted from the battery ECU 20 has been received by the wireless communication unit 60 directly or indirectly via another device, the control unit 40 functions to recognize the temperature or voltage of the battery 10 based on a signal transmitted from the detection unit 50, and perform response processing of transmitting information relating to the temperature or voltage of the battery 10 to another battery monitoring device 30 or the battery ECU 20. Furthermore, if a predetermined cell balance instruction transmitted from the battery ECU 20 has been received by the wireless communication unit 60 directly or indirectly via another device, the control unit 40 functions to perform cell balance processing to control the plurality of battery cells 12 to charge or discharge so that inter-terminal voltages (i.e. the voltages between the terminals) of the battery cells 12 are equalized based on detection results of the detection unit 50.

The detection unit 50 includes the detection/adjustment circuit unit 36 that functions as a voltage detection unit for detecting the voltage at a predetermined position of the battery 10, and a temperature detection unit 38 for detecting the temperature of the battery 10.

The detection/adjustment circuit unit 36 detects voltage information that specifies inter-terminal voltages of the battery cells 12 of the battery 10, in which the plurality of battery cells 12 are connected to each other. The detection/adjustment circuit unit 36 is provided with a plurality of voltage signal lines 14, and a plurality of discharge units 16 that are respectively connected in parallel with the plurality of battery cells 12. Note that, in FIG. 2, illustration of some of the battery cells 12 (unit battery) is omitted, and illustration of circuits that correspond to the omitted battery cells 12 is also omitted.

As shown in FIG. 2, the plurality of voltage signal lines 14 are electrically connected to inter-battery electrode portions 11C of the assembled battery 11, and end electrode portions 11A and 11B of the assembled battery 11, the assembled battery 11 being constituted by the plurality of battery cells 12 connected in series to each other. The electrode portion 11A is an electrode portion, at one end, of the assembled battery 11 and has the largest potential of the assembled battery 11. The electrode portion 11B is an electrode portion, at another end, of the assembled battery 11 and has the smallest potential of the assembled battery 11. The inter-battery electrode portions 11C are portions that are located between two of the battery cells 12 (unit batteries) connected in series to each other and in which the positive electrode on one side and the negative electrode on the other side are electrically connected to each other. The potentials of the plurality of inter-battery electrode portions 11C are larger toward the electrode portion 11A. The plurality of voltage signal lines 14 are signal lines through which analog signals indicating the potentials of the electrode portions 11A, 11B, and 11C are input to the control unit 40.

The control unit 40 can detect terminal voltages of the battery cells 12 (per unit battery) based on the analog voltage signals input through the respective voltage signal lines 14. Note that the control unit 40 includes an A/D converter that converts analog voltage signals input through the respective voltage signal lines 14 into digital signals. Because the control unit 40 can recognize the potentials of the electrode portions 11A, 11B, and 11C, the control unit 40 can also calculate inter-terminal voltages of the battery cells 12 (a voltage of each battery cell 12).

Note that current-limiting resistors may be provided on the respective voltage signal lines 14 to limit a current that flows into the control unit 40 from the battery cells 12 although, in FIG. 2, illustration of such current-limiting resistors and the like is omitted. Furthermore, it is desirable to arrange and connect, between voltage signal lines 14, a Zener diode (not shown) for clamping the voltage between voltage signal lines that occurs at the time of overvoltage, in parallel with each battery cell 12 (specifically, a Zener diode is connected in parallel with each battery cell 12 in such a manner that its cathode is connected to the positive electrode of the battery cell 12 and its anode is connected to the negative electrode thereof).

The temperature detection unit 38 is constituted by, for example, a well-known temperature sensor, and is arranged in such a manner that it is in contact with a surface of the assembled battery 11 or the stack 10A that is shown in FIG. 1 (the surface of the stack 10A being, for example, an outer surface or an inner surface of the case in which the assembled battery 11 is housed), or it is close thereto without being in contact therewith. The temperature detection unit 38 outputs a voltage value that indicates the temperature at the position at which it is arranged (that is, the temperature of the surface of the assembled battery 11 or the temperature in the vicinity of the surface) and inputs it to the control unit 40.

The monitoring IC 32 including the control unit 40 and the detection/adjustment circuit unit 36 serves as a cell balance circuit that makes the voltages or capacities of the battery cells 12 equal to each other. This cell balance circuit is, for example, a circuit that minimizes the variation in the voltages of the plurality of battery cells 12 as much as possible so that they are equal to each other. For example, it is conceivable to use a passive cell balance circuit that detects, from the assembled battery 11 assigned to a battery monitoring device 30, the battery cell 12 that has the smallest difference in potential between its positive electrode and negative electrode (inter-terminal voltage), and causes the other battery cells 12 to discharge to bring their voltages closer to the voltage of the detected battery cell 12 (that is, the battery cell 12 that has the smallest inter-terminal voltage).

The wireless communication unit 60 may be a circuit that performs wireless communication using a well-known wireless communication method, and the medium and frequency of wireless signals are not limited. For example, radio waves may be appropriately used as a medium, but infrared light or the like may also be used. Alternatively, electromagnetic waves may also be used instead. The wireless communication unit 60 operates, when a wireless signal is transmitted from the wireless communication unit 60 of another battery monitoring device 30 or a wireless communication unit 24 of the battery ECU 20, so as to receive this wireless signal. Furthermore, the wireless communication unit 60 performs wireless transmission in accordance with control of the control unit 40, and operates to transmit information relating to the battery 10 to the wireless communication unit 60 of another battery monitoring device 30 or the wireless communication unit 24 of the battery ECU 20.

As shown in, for example, FIGS. 3(A) and 3(B), the thus-configured battery monitoring device 30 is attached to the battery 10. In the example of FIG. 3, the battery monitoring device 30 has a substrate portion 70 configured as a well-known printed-wiring board or the like, and is integrated with the assembled battery 11 with the substrate portion 70 directly fixed to the assembled battery 11. The substrate portion 70 may also be a rigid substrate or an FPC. The substrate portion 70 may also be, for example, a well-known busbar substrate. Furthermore, the substrate portion 70 may also be a mono-layer substrate or a multi-layer substrate. The above-described monitoring IC 32 and the wireless communication unit 60 are mounted on the substrate portion 70, and are integrated with the battery 10 via the substrate portion 70. Note that, in FIG. 3, illustration of the wiring pattern of the substrate portion 70 and other electronic components is omitted.

In the example of FIG. 3, the substrate portion 70 is fixed to terminal portions 12A and 12B (protruding portions serving as a positive electrode or a negative electrode) of the battery cells 12 constituting the assembled battery 11, and the above-described voltage signal lines 14 electrically connected to the terminal portions 12A and 12B are formed as the wiring pattern of the substrate portion 70. A terminal portion 12A is a protruding portion that serves as the positive electrode of a battery cell 12, and a terminal portion 12B is a protruding portion that serves as the negative electrode of the battery cell. Note that the structure shown in FIG. 3 is merely an example of an attachment structure, and the present disclosure is not limited to this example. For example, the substrate portion 70 does not need to be directly fixed to the battery 10 but may be indirectly attached thereto via another member.

The temperature sensor that constitutes the temperature detection unit 38 shown in FIGS. 1 and 2 may also be mounted at a position of the substrate portion 70 at which it is in contact with the battery 10 or a position at which it is in proximity to the battery 10. Alternatively, instead of being mounted on the substrate portion 70, the temperature sensor may be fixed to the battery 10 directly or indirectly via another member. If the temperature detection unit 38 is not mounted on the substrate portion 70, it is sufficient that the temperature detection unit 38 and the substrate portion 70 are electrically connected to each other via a wiring portion or the like.

The following will describe the battery ECU 20.

The battery ECU 20 shown in FIG. 1 corresponds to an example of an external control device, and is configured to be able to receive information transmitted from the wireless communication units 60 of the battery monitoring devices 30, the battery ECU 20 being configured as an electronic control device that can perform various types of control. Furthermore, the battery ECU 20 can communicate with an external ECU shown in FIG. 1 (the power management ECU 120 of FIG. 1).

The battery ECU 20 includes the wireless communication unit 24, which performs wireless communication, and a determination unit 22, which performs various types of determination such as voltage abnormality determination. Specifically, as shown in FIG. 2, in the battery ECU 20, the wireless communication unit 24 and a well-known microcomputer 21 are provided, the microcomputer 21 serving as the determination unit 22. The microcomputer 21 includes, for example, a CPU, a storage unit (such as a ROM and a RAM), an AD converter, and the like, and can perform various types of control.

The thus-configured battery ECU 20 is configured to be able to wirelessly communicate with the battery monitoring devices 30. Note however that, when wireless communication is actually performed, one of the battery monitoring devices 30 is taken as a communication target, and when performing reception, the battery ECU 20 receives information wirelessly transmitted from the wireless communication unit 60 of the battery monitoring device 30 taken as a communication target. Also, when performing transmission, the battery ECU 20 wirelessly transmits information to the wireless communication unit 60 of the battery monitoring device 30 taken as the communication target.

The thus-configured battery monitoring system 1 can be arranged at a predetermined position within a vehicle while being housed together with the battery 10 in a metal case, for example. When the plurality of battery monitoring devices 30 and the battery ECU 20 are housed together in the same metal case, it is possible to suppress external noise using the metal case, and wireless communication can be well performed within the case. Furthermore, it is desirable to arrange such a case in which the battery 10 and the battery monitoring system 1 are housed, at a position within the vehicle that is apart from a noise generation source such as a motor or an alternator that serves as a traveling power source, and, for example, the case can be appropriately arranged at a position below a seat provided in the vehicle. Furthermore, if the motor, the alternator, or the like that serves as a traveling power source is arranged at a position close to the front end of the vehicle, the battery monitoring system 1 is preferably arranged at a position close to the back end of the vehicle. In contrast, if the motor, the alternator, or the like that serves as a traveling power source is arranged at a position close to the back end of the vehicle, the battery monitoring system 1 is preferably arranged at a position close to the front end of the vehicle. Note however that these examples are merely preferred examples, and the battery monitoring system 1 may be arranged at any position in the vehicle.

As shown in FIG. 1, the battery ECU 20 can communicate with the power management ECU 120 disposed on the outside with or without wires, but the power management ECU 120 may be disposed outside or inside of the above-described metal case. For example, a configuration is also possible in which the battery ECU 20 housed in the case and the power management ECU 120 disposed outside of the case are communicably connected to each other via a communication line such as a CAN communication line, and can transmit and receive information to and from each other.

The following will describe an overview of characteristic configurations of the overall battery monitoring system 1.

Figure 6:
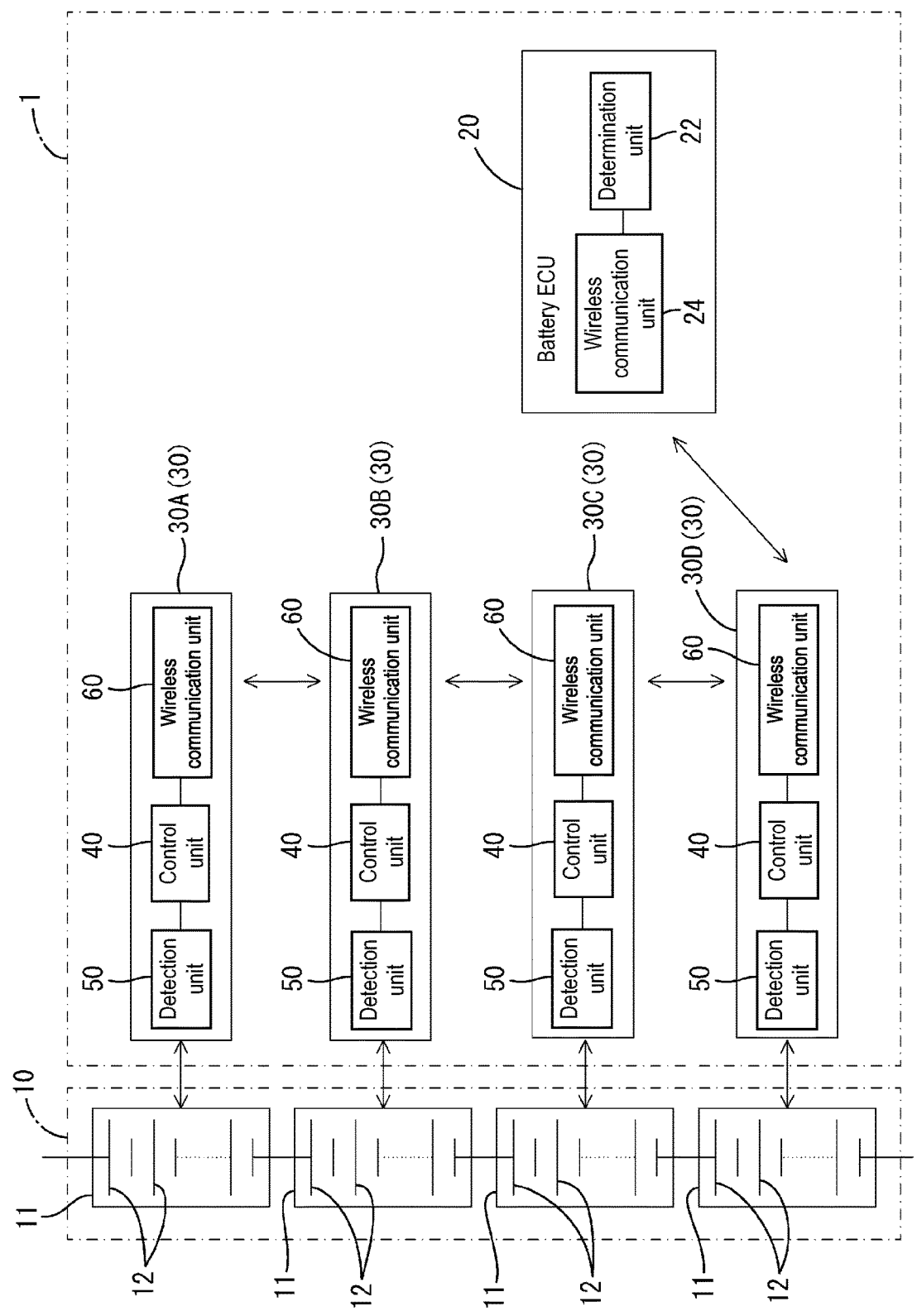
FIG. 6 is a diagram schematically illustrating, in the battery monitoring system of Embodiment 1, a communication aspect when all of the battery monitoring devices are in a normal state.

As shown in FIG. 1, the battery monitoring system 1 has a configuration including a plurality, namely, three or more battery monitoring devices 30, and a battery ECU 20 (external control device) configured to receive information transmitted from the wireless communication unit 60 of any one of the plurality of battery monitoring devices 30. Note that the following will describe a case where, as shown in the example of FIG. 6, the battery ECU 20 and the lowermost monitoring device 30D can wirelessly communicate with each other directly without going through another device as a representative example, but a configuration is also possible in which the battery ECU 20 and the lowermost monitoring device 30D wirelessly communicate with each other via a relay device.

The battery monitoring system 1 shown in FIG. 1 is configured such that the plurality of battery monitoring devices 30 serially transmit information, and a basic order in which information is transmitted is determined in advance. Specifically, one of the four battery monitoring devices 30 is defined as a topmost monitoring device 30A at the highest rank (rank 1) and another device is defined as a lowermost monitoring device 30D at the lowest rank (rank 4). Devices other than the topmost monitoring device 30A and the lowermost monitoring device 30D are defined as intermediate monitoring devices 30B and 30C. The intermediate monitoring device 30B is a battery monitoring device 30 at the rank 2, and the intermediate monitoring device 30C is a battery monitoring device at the rank 3. Furthermore, a unique ID is assigned to each battery monitoring device 30, and the unique ID assigned to each device is stored in a not-shown storage unit. For example, a unique ID 1 is assigned to the topmost monitoring device 30A, a unique ID 2 is assigned to the intermediate monitoring device 30B, a unique ID 3 is assigned to the intermediate monitoring device 30C, and a unique ID 4 is assigned to the lowermost monitoring device 30D.

In the battery monitoring system 1 shown in FIG. 1, when pieces of detection information detected in the battery monitoring devices 30 are transmitted to the battery ECU 20 in a normal state in which none of the battery monitoring devices 30 has a failure, the transmission is performed such that the information is given in the descending order from the topmost monitoring device 30A, which is the battery monitoring device 30 at the highest rank (with the smallest value). For example, if a predetermined transmission condition is met (for example, upon receiving instruction information that contains a notification instruction), the topmost monitoring device 30A at the rank 1 takes the battery monitoring device 30 at the next lower rank (that is, the intermediate monitoring device 30B at the rank 2) as a destination, and wirelessly transmits wireless transmission data that contains detection information generated by the topmost monitoring device 30A to this destination. Each of the intermediate monitoring devices 30B and 30C transmits, when wireless transmission data is given to it through wireless transmission from the battery monitoring device 30 at the next higher rank, new wireless transmission data obtained by adding detection information generated by itself to the given wireless transmission data, to the battery monitoring device 30 at the next lower rank. For example, the intermediate monitoring device 30B transmits, when the wireless transmission data containing the detection information of the topmost monitoring device 30A is given to it through wireless transmission from the battery monitoring device 30 at the next higher rank (that is, the topmost monitoring device 30A at the rank 1), new wireless transmission data obtained by adding the detection information generated by itself to the given wireless transmission data, to the battery monitoring device 30 at the next lower rank (that is, the intermediate monitoring device 30C at the rank 3). Also, the intermediate monitoring device 30C transmits, when the wireless transmission data containing the detection information of the topmost monitoring device 30A and the intermediate monitoring device 30B is given to it through wireless transmission from the battery monitoring device 30 at the next higher rank (that is, the intermediate monitoring device 30B at the rank 2), new wireless transmission data obtained by adding detection information generated by itself to the given wireless transmission data, to the battery monitoring device 30 at the next lower rank (that is, the lowermost monitoring device 30D at the rank 4). The lowermost monitoring device 30D wirelessly transmits, when the wireless transmission data containing the detection information of the topmost monitoring device 30A and the intermediate monitoring devices 30B and 30C is given to it through wireless transmission from the battery monitoring device 30 at the next higher rank (that is, the intermediate monitoring device 30C at the rank 3), new wireless transmission data obtained by adding detection information generated by itself to the given wireless transmission data, to the battery ECU 20 (external control device). In this manner, the data that contains the pieces of detection information generated by the respective battery monitoring devices 30 is transmitted via wireless communication from the lowermost monitoring device 30D to the battery ECU 20. The above-described operation is a basic operation performed when information from the plurality of battery monitoring devices 30 is transmitted to the battery ECU 20.

Furthermore, in the battery monitoring system 1, when instruction information (instruction information that specifies a predetermined instruction) is given from the battery ECU 20 (external control device) to the battery monitoring devices 30 in the normal state in which none of the battery monitoring devices 30 has a failure, the transmission of the information is performed in the following manner. First, the battery ECU 20 wirelessly transmits the instruction information to the lowermost monitoring device 30D. The lowermost monitoring device 30D takes, when data that corresponds to the instruction information (data that contains an instruction specified by the instruction information) is given to it through wireless transmission from the battery ECU 20 (external control device), the battery monitoring device 30 at the next higher rank (that is, the intermediate monitoring device 30C at the rank 3) as a destination, and wirelessly transmits the data that contains the instruction specified by the instruction information to this destination. Note that the data that contains an instruction specified by the instruction information may be instruction information itself, or data obtained by processing the instruction information. The intermediate monitoring device 30C takes, when the data that contains the instruction specified by the instruction information is given to it through wireless transmission from the battery monitoring device 30 at the next lower rank (that is, the lowermost monitoring device 30D at the rank 4), the battery monitoring device 30 at the next higher rank (that is, the intermediate monitoring device 30B at the rank 2) as a destination, and wirelessly transmits the data that contains the instruction specified by the instruction information to this destination. The intermediate monitoring device 30B takes, when the data that contains the instruction specified by the instruction information is given to it through wireless transmission from the battery monitoring device 30 at the next lower rank (that is, the intermediate monitoring device 30C at the rank 3), the battery monitoring device 30 at the next higher rank (that is, the topmost monitoring device 30A at the rank 1) as a destination, and wirelessly transmits the data that contains the instruction specified by the instruction information to this destination. Also, upon receiving data that contains an instruction specified by the instruction information (the instruction information itself or data obtained by processing the instruction information), each of the plurality of battery monitoring devices 30 performs control that corresponds to the instruction specified by the instruction information.

The following will describe an operation of the battery monitoring system 1 in detail.

Figure 4:
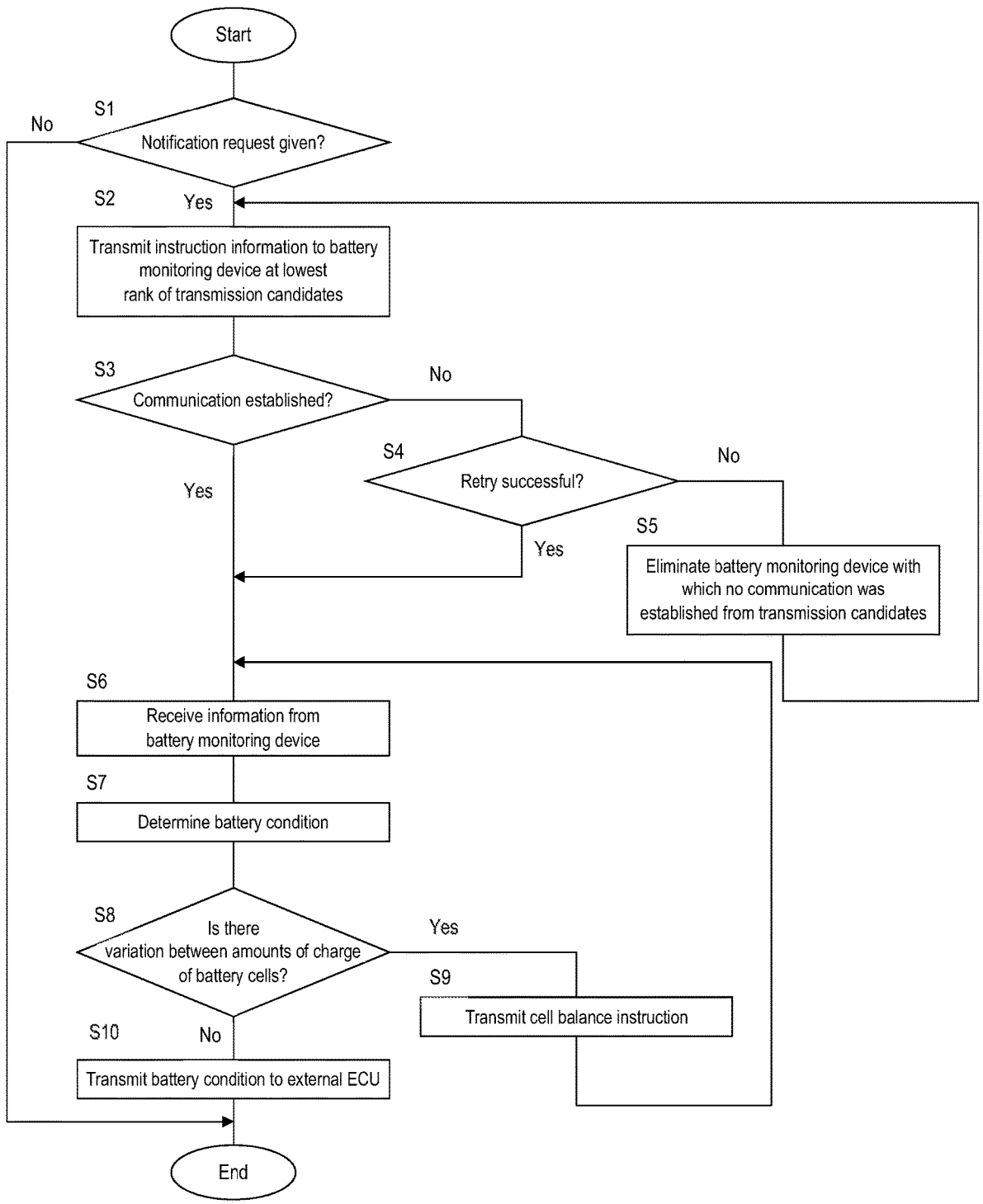
FIG. 4 is a flowchart illustrating an example of a flow of control that is executed by a battery ECU.

In the battery monitoring system 1, the battery ECU 20 performs control in a flow as shown in FIG. 4. The control of FIG. 4 is executed specifically by the microcomputer 21 of the battery ECU 20, and the microcomputer 21 successively repeats the control of FIG. 4 in short time intervals, while an ignition switch is ON.

After the start of the control of FIG. 4, the battery ECU 20 determines whether or not a notification request has been made by the power management ECU 120. The power management ECU 120 is configured to transmit information indicating a predetermined notification request (request for notification of the condition of the battery 10) to the battery ECU 20 at a predetermined timing, and the battery ECU 20 determines, in step S1, whether or not a notification request has been made by the power management ECU 120. Note that the timing at which a notification request is transmitted from the power management ECU 120 to the battery ECU 20 may be, for example, a timing immediately after the ignition switch is turned ON from OFF, or may be another predetermined diagnosis timing.

If, in step S1, it is determined that a notification request has been made by the power management ECU 120, the battery ECU 20 takes, in step S2, the device at the lowest rank (with the largest number) of the plurality of battery monitoring devices 30 serving as communication candidates, as a target device, and transmits instruction information that contains the unique ID of the target device and a predetermined notification instruction to the target device. The notification instruction is an instruction that prompts a battery monitoring device 30 to transmit a predetermined item of information. Furthermore, the expression "communication candidates" mentioned with respect to step S2 refers to all of the battery monitoring devices 30 but the battery monitoring device 30 that is eliminated in step S5 (battery monitoring device 30 that is determined as having a failure). For example, if processing of step S5 is not yet executed, and all of the battery monitoring devices 30 are in the normal state (all of the battery monitoring devices 30 are communication candidates) as shown in FIG. 6, the battery ECU 20 takes, in step S2, the lowermost monitoring device 30D, which is the device at the lowest rank (with the largest number) of all of the battery monitoring devices 30 as a target device, and transmits instruction information that contains the unique ID (unique ID 4) of the lowermost monitoring device 30D and a predetermined notification instruction to this target device. Note that each battery monitoring device 30 is configured to, upon acquiring information that contains its own unique ID, perform processing that corresponds to the information, and is configured to, upon receiving information that does not contain its own unique ID, discard or ignore this information, for example.

When having transmitted, in step S2, the instruction information to any one of the battery monitoring devices 30, the battery ECU 20 determines whether or not communication with the target battery monitoring device 30 has been established. For example, each battery monitoring device 30 is configured to return predetermined response information upon receiving instruction information that contains its own unique ID, and when the battery ECU 20 has taken, in step S2, one battery monitoring device 30 as a target and transmitted instruction information that contains the unique ID of this battery monitoring device 30 thereto, the battery ECU 20 performs processing in step S6 if it is determined that response information that corresponds to the transmission has been received during a given length of time after the transmission (Yes in step S3), whereas the battery ECU 20 performs processing in step S4 if it is determined that such response information has not been received (No in step S3). For example, when the battery ECU 20 has taken, in step S2, the lowermost monitoring device 30D as a communication target, and transmitted instruction information that contains the unique ID (ID 4) of the lowermost monitoring device 30D thereto, the battery ECU 20 will move to step S4 if it is determined that response information that corresponds to the transmission has not been received during a given length of time after the transmission.

When moving to step S4, the battery ECU 20 retries to communicate with the battery monitoring device 30 taken as a communication target in step S2 for a certain period of time or a certain number of times, and determines again whether or not communication with this battery monitoring device 30 has been established. If it is determined that the communication retried in step S4 has been established (Yes in step S4), the battery ECU 20 performs processing in step S6, whereas if it is determined that such communication has not been established (No in step S4) despite the communication retrial in step S4, the battery ECU 20 performs processing in step S5.

Figure 7:
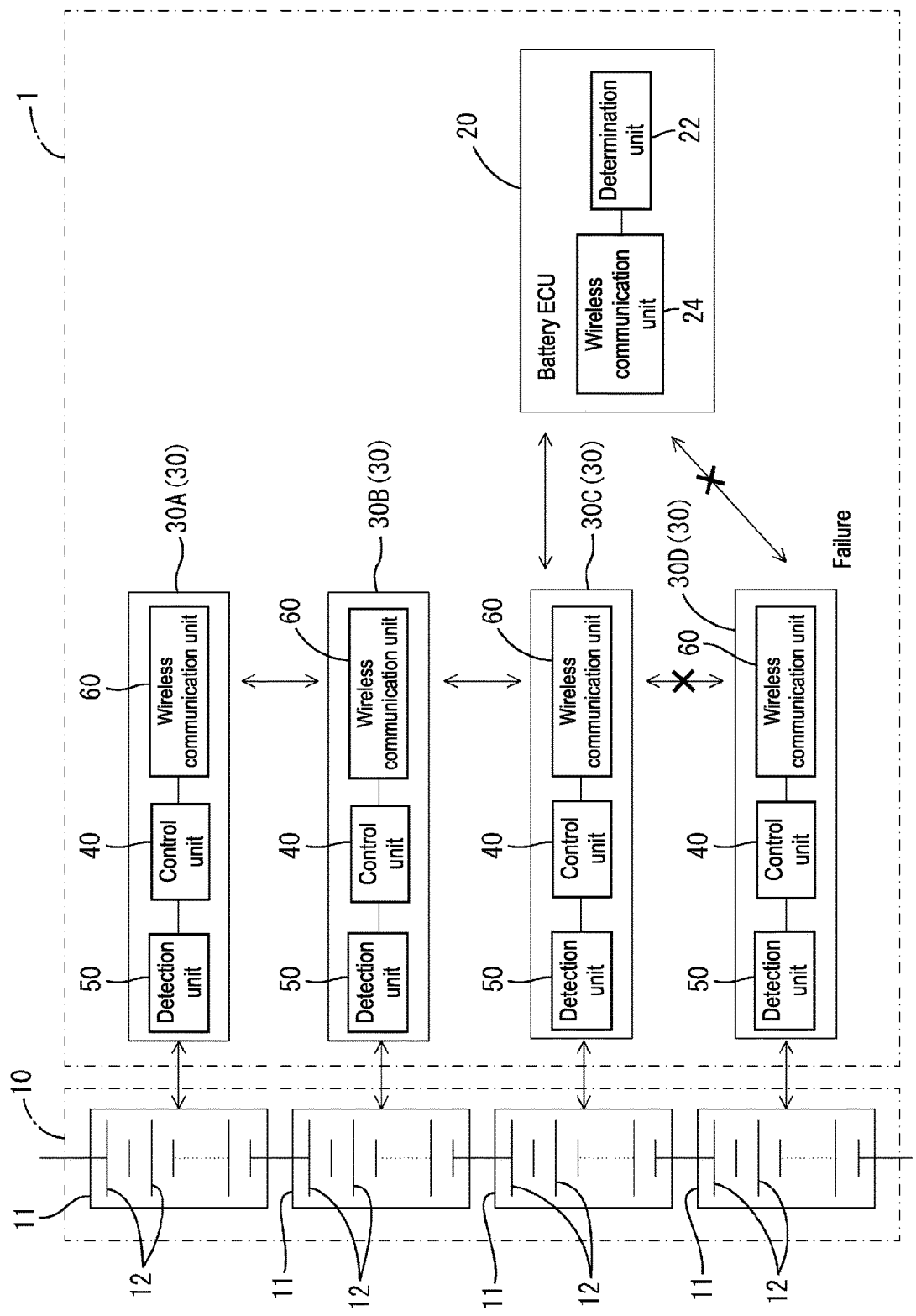
FIG. 7 is a diagram schematically illustrating, in the battery monitoring system of Embodiment 1, a communication aspect when a lowermost monitoring device is in an abnormal state.

When performing the processing in step S5, the battery ECU 20 determines the battery monitoring device 30 with which the communication was tried in the previous steps S2 and S4 as having a failure, and eliminates it from the transmission candidates, and then performs the processing in step S2 again. When the processing in step S2 is executed after step S5, instruction information is transmitted to the battery monitoring device at the lowest rank of the new transmission candidates excluding the battery monitoring device 30 eliminated from the transmission candidates in step S5. For example, if, as shown in FIG. 7, the lowermost monitoring device 30D has a failure, communication with the lowermost monitoring device 30D will not be established even when communication is tried in step S2 for the first time, and thus the procedure will move to step S4, and also in step S4, communication will not be established, and thus the procedure will move to step S5. In this case, in step S5, the plurality of battery monitoring devices 30 (the topmost monitoring device 30A, and the intermediate monitoring devices 30B and 30C) excluding the lowermost monitoring device 30D serve as new transmission candidates, and in subsequent step S2, the intermediate monitoring device 30C at the lowest rank (with the largest number) in the new transmission candidates will be taken as a transmission target, and instruction information that contains the unique ID of the intermediate monitoring device 30C will be transmitted to it.

If it is determined, in step S3 or step S4, that communication with the battery monitoring device 30 taken as a transmission target has been established, the battery ECU 20 will move to step S6. In this case, the battery ECU 20 will wait for transmission of information that corresponds to the instruction information from the battery monitoring device 30. Note that the procedure from step S6 onwards will be described later.

Figure 5:
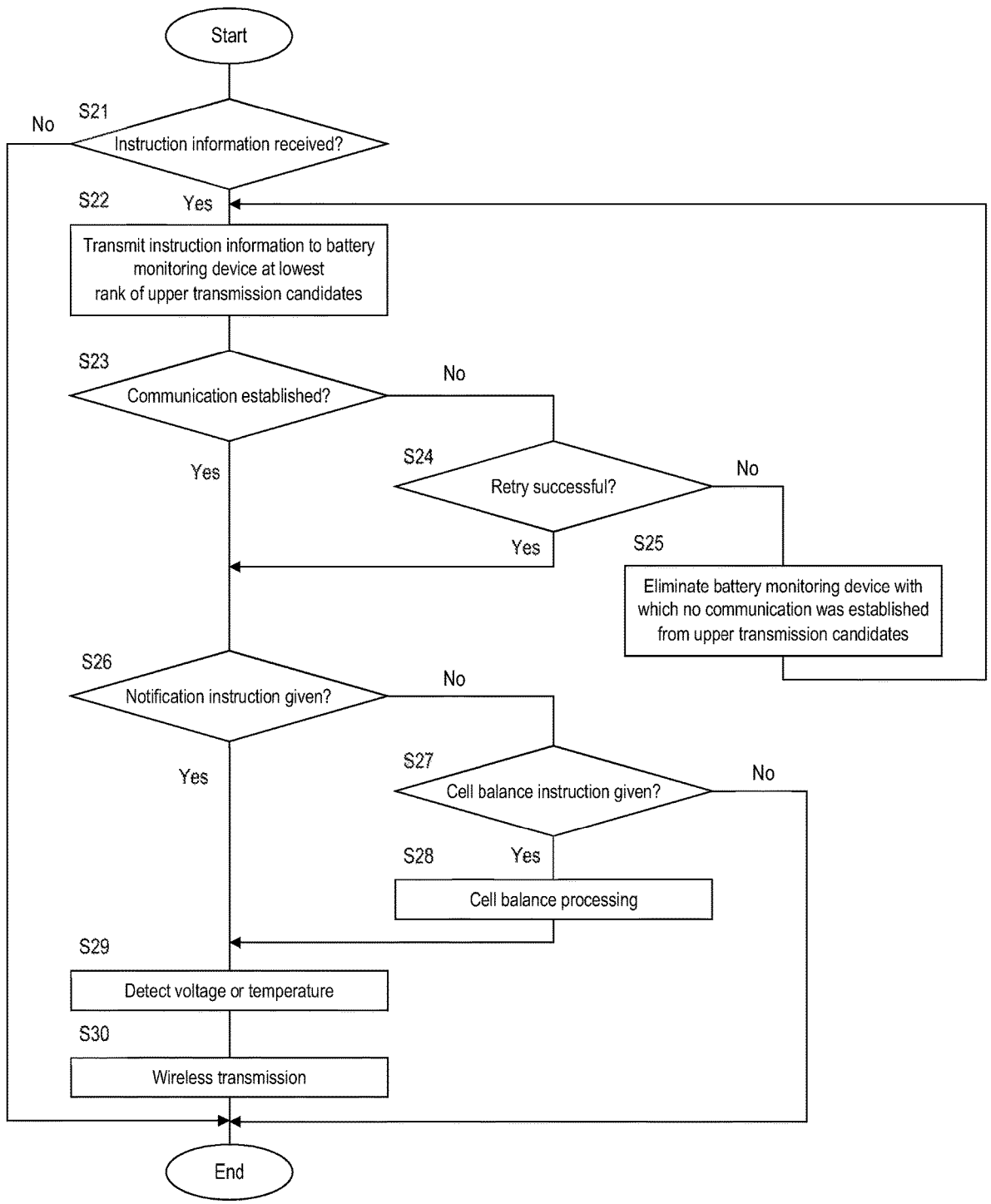
FIG. 5 is a flowchart illustrating an example of a flow of control that is executed by each of battery monitoring devices.

The battery monitoring devices 30 are configured to perform control in a flow as shown in FIG. 5. The control of FIG. 5 is executed by, for example, the control unit 40 of each battery monitoring device 30, and the control unit 40 successively repeats the control of FIG. 4 in short time intervals, while the ignition switch is ON.

In each battery monitoring device 30, after the start of the control of FIG. 5, the control unit 40 determines, in step S21, whether or not instruction information has been received. If it is determined that instruction information wirelessly transmitted from the battery ECU 20 or a battery monitoring device 30 at a lower rank has been received, the control unit 40 of each battery monitoring device 30 moves to "Yes" in step S21, and transmits the received instruction information to the battery monitoring device 30 at the lowest rank in transmission candidates, namely, those battery monitoring devices 30 having a higher rank (upper transmission candidates). At this time, the unique ID of the destination battery monitoring device 30 is contained in the instruction information. For example, when, as shown in FIG. 6, all of the battery monitoring devices 30 are in the normal state, and instruction information has been transmitted from the battery ECU 20 to the lowermost monitoring device 30D, the lowermost monitoring device 30D that has received this instruction information determines "Yes" in step S21, and takes the intermediate monitoring device 30C at the lowest rank of the upper transmission candidates, namely, the topmost monitoring device 30A and the intermediate monitoring devices 30B and 30C, as a destination, and transmits the instruction information that contains the unique ID of the intermediate monitoring device 30C to this destination. Alternatively, when the instruction information has been transmitted from the lowermost monitoring device 30D to the intermediate monitoring device 30C, the intermediate monitoring device 30C that has received this instruction information determines "Yes" in step S21 in the control shown in FIG. 5, and takes the intermediate monitoring device 30B at the lower rank of the upper transmission candidates, namely, the topmost monitoring device 30A and the intermediate monitoring device 30B, as a destination, and transmits the instruction information that contains the unique ID of the intermediate monitoring device 30B to this destination. Similarly, when the instruction information has been transmitted from the intermediate monitoring device 30C to the intermediate monitoring device 30B, the intermediate monitoring device 30B that has received this instruction information determines "Yes" in step S21 in the control of FIG. 5, and takes the topmost monitoring device 30A serving as the upper transmission candidate as a destination, and transmits the instruction information that contains the unique ID of the topmost monitoring device 30A to this destination. The instruction information wirelessly transmitted from the battery ECU 20 to one battery monitoring device 30 is transmitted to the upper side in this manner. Furthermore, each battery monitoring device 30 performs the processing in step S22 upon receiving instruction information that contains its own unique ID, and returns response information to where this instruction information was sent from.

When any battery monitoring device 30 has transmitted instruction information to another battery monitoring device 30 on the upper side in step S22, the battery monitoring device 30 determines, in step S23, whether or not communication with this other battery monitoring device 30 has been established. When a battery monitoring device 30 has transmitted, to another battery monitoring device 30, instruction information that contains the unique ID of this battery monitoring device 30 in step S22, the battery monitoring device 30 performs processing in step S24 if it is determined that response information that corresponds to the transmission has not been received during a given length of time after the transmission (No in step S23), whereas the battery monitoring device 30 performs processing in step S26 if it is determined that such response information has been received (Yes in step S23). For example, when the lowermost monitoring device 30D has transmitted, to the intermediate monitoring device 30C serving as a communication target, instruction information that contains the unique ID of this intermediate monitoring device 30C in step S22, the lowermost monitoring device 30D will move to step S24 if it is determined that response information that corresponds to the transmission has not been received during a given length of time after the transmission.

Figure 8:
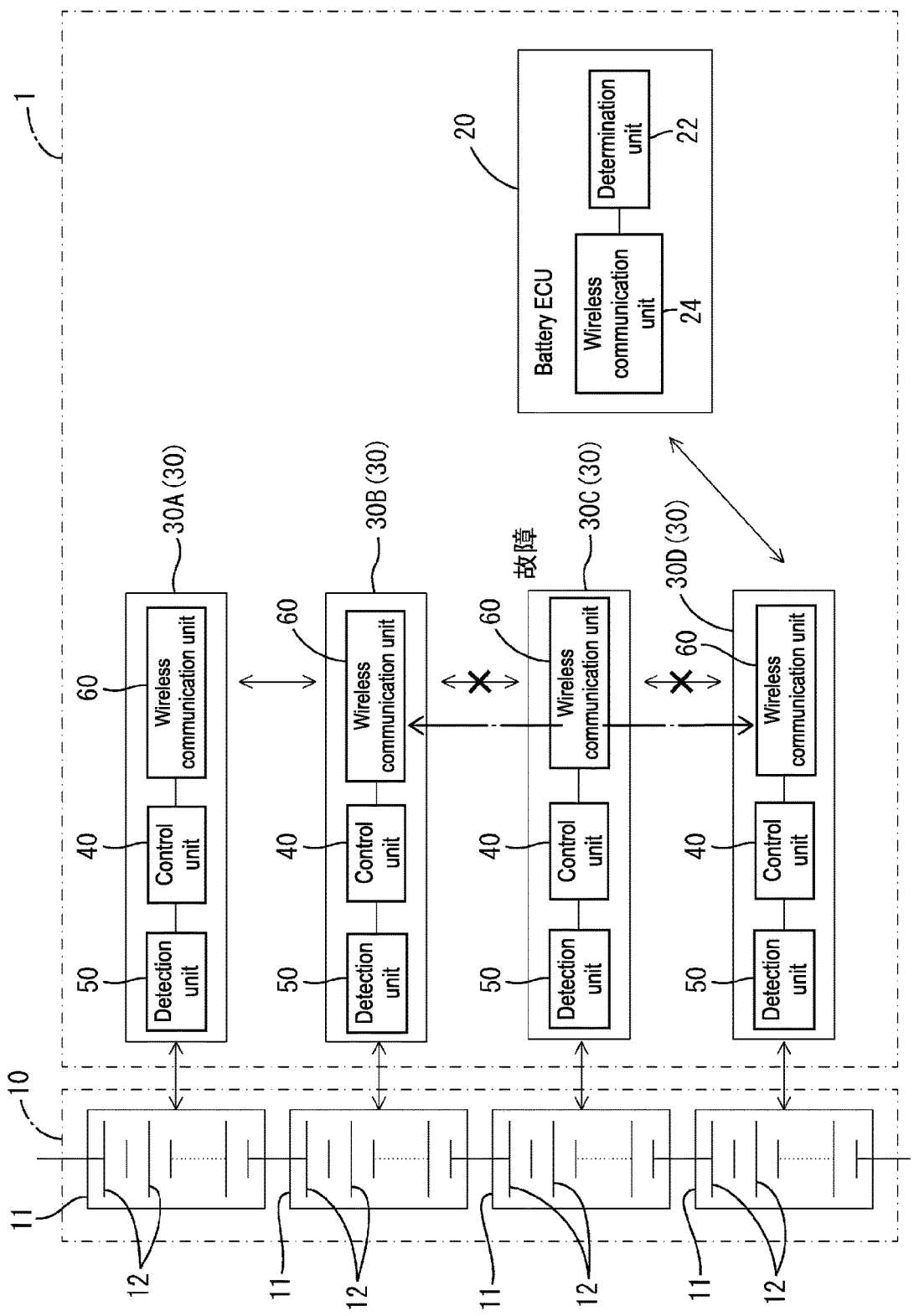
FIG. 8 is a diagram schematically illustrating, in the battery monitoring system of Embodiment 1, a communication aspect when an intermediate monitoring device is in an abnormal state.

When moving to step S24, each battery monitoring device 30 retries to communicate with the other battery monitoring device 30 taken as a communication target in step S22 for a certain period of time or a certain number of times, and determines again whether or not communication with this battery monitoring device 30 has been established. If it is determined that the communication retried in step S24 has been established (Yes in step S24), the battery monitoring device 30 performs processing in step S26, whereas if it is determined that such communication has not been established (No in step S24) despite the communication retrial in step S24, the battery monitoring device 30 performs processing in step S25. When performing the processing in step S25, the battery monitoring device 30 determines the battery monitoring device 30 with which the communication was tried in the previous steps S22 and S24 as having a failure, and eliminates it from the upper transmission candidates, and then performs the processing in step S22 again. When the processing in step S22 is executed after step S25, the battery monitoring device 30 at the lowest rank of the new upper transmission candidates excluding the battery monitoring device 30 eliminated from the upper transmission candidates in step S25 is taken as a destination, and instruction information that contains the unique ID of this battery monitoring device 30 is transmitted to this destination. For example, if the lowermost monitoring device 30D performs the control shown in FIG. 5 in a state in which, as shown in FIG. 8, the intermediate monitoring device 30C has a failure, communication with the intermediate monitoring device 30C will not be established even when communication is tried in step S22 for the first time, and thus the procedure will move to step S24, and also in step S24, communication will not be established, and thus the procedure will move to step S25. In this case, in step S25, the plurality of battery monitoring devices 30 (the topmost monitoring device 30A and the intermediate monitoring device 30B) excluding the intermediate monitoring device 30C eliminated from the battery monitoring devices 30 having a higher rank (with smaller numbers) than the lowermost monitoring device 30D serve as new upper transmission candidates, and in subsequent step S22, the intermediate monitoring device 30B at the lowest rank (with the largest number) of the new upper transmission candidates will be taken as a transmission target, and instruction information that contains the unique ID of the intermediate monitoring device 30B will be transmitted. In other words, the instruction information will be wirelessly transmitted from the lowermost monitoring device 30D to intermediate monitoring device 30B while skipping the intermediate monitoring device 30C.

Note that, when the topmost monitoring device 30A performs the control shown in FIG. 5, the processing in steps S22 to S25 are omitted. Furthermore, if there is no upper transmission candidate as a result of eliminating processing performed by any one of the battery monitoring devices 30 in step S25, the procedure may move to step S26.

When performing the processing in step S26, each battery monitoring device 30 determines whether or not the received instruction information (instruction information that contains its own unique ID) contains a predetermined notification instruction. If it is determined that the received instruction information contains the notification instruction (Yes, in step S26), the battery monitoring device 30 detects, in step S29, voltages and a temperature. Specifically, the control unit 40 of the battery monitoring device 30 that performs the processing of step S26 calculates inter-terminal voltages of the battery cells 12 of the assembled battery 11 to which this battery monitoring device 30 is assigned, based on analog voltage values input through the voltage signal lines 14 shown in FIG. 2. Furthermore, the control unit 40 recognizes the temperature of the battery 10 (specifically, the temperature of the assigned assembled battery 11) based on a detection value input from the corresponding temperature detection unit 38.

After having detected the inter-terminal voltages of the battery cells 12 and the temperature of the assembled battery 11 in step S29, the control unit 40 wirelessly transmits information relating to them in step S30. For example, when the topmost monitoring device 30A executes the processing in step S30 in the control shown in FIG. 5, the topmost monitoring device 30A serves as a transmission starting point, and transmits wireless transmission data that contains the information (detection information) detected in step S29 to the battery monitoring device 30 at a lower rank that has transmitted the instruction information to this topmost monitoring device 30A. Furthermore, if there is no upper transmission candidate as a result of the processing in step S25 performed by any one of the battery monitoring devices 30, and the procedure moves to step S26, this battery monitoring device 30 serves as a transmission starting point, and transmits wireless transmission data that contains the information (detection information) detected in step S29 to the battery monitoring device 30 at a lower rank that has transmitted the instruction information to the former battery monitoring device 30.

Of the battery monitoring devices 30 that do not serve as a transmission starting point, the device that has received the instruction information from another battery monitoring device 30 (device located at an intermediate position of the transmission path) receives, when executing the processing in step S30 in the control shown in FIG. 5, wireless transmission data from the battery monitoring device 30 at a higher rank to which that battery monitoring device 30 has given the instruction information in the control shown in FIG. 5 (device for which it is determined that communication therewith has been established in step S23 or S24), then adds the information (detection information) detected by itself in step S29 to this wireless transmission data to generate new wireless transmission data, and wirelessly transmits the new wireless transmission data to the battery monitoring device 30 at a lower rank that has given the instruction information to that battery monitoring device 30.

Of the battery monitoring devices 30, the device that has received the instruction information from the battery ECU 20 receives, when executing the processing in step S30 in the control shown in FIG. 5, wireless transmission data from the battery monitoring device 30 at a higher rank to which that battery monitoring device 30 has given the instruction information in the control shown in FIG. 5 (device for which it is determined that communication therewith has been established in step S23 or S24), then adds the information (detection information) detected by itself in step S29 to the wireless transmission data to generate new wireless transmission data, and wirelessly transmits the new wireless transmission data to the battery ECU 20.

As shown in FIG. 4, if "Yes" in step S3 or S4, the battery ECU 20 stands by for a certain length of time and then receives a response to the transmitted instruction information (information indicating the voltages and the temperature that is transmitted as a result of each battery monitoring device 30 performing the processing of step S29). Specifically, wireless transmission data that is wirelessly transmitted from the battery monitoring device 30 for which it is determined that communication therewith has been established in step S3 or S4 (data transmitted by this battery monitoring device 30 in step S30) is received.

After having received the wireless transmission data from the battery monitoring device 30 in the processing in step S6, the battery ECU 20 performs processing in step S7 to determine the condition of the battery 10 based on the received wireless transmission data. Specifically, the determination unit 22 (that is, the microcomputer 21) calculates the overall voltage of the battery 10 (battery voltage) based on the wireless transmission data (data containing detection information of the plurality of battery monitoring devices 30). For example, the overall voltage of the battery 10 can be calculated by integrating the overall voltages of the assembled batteries 11 to which the battery monitoring devices 30 are respectively assigned. Alternatively, the overall voltage of the battery 10 can be calculated by integrating the inter-terminal voltages of all of the battery cells 12. Alternatively, it is also possible to recognize the overall voltage of the battery 10 by recognizing the voltage across the terminal having the highest electric potential detected by the topmost monitoring device 30A (terminal of the battery 10 that has the highest voltage). Also, the determination unit 22 determines whether or not the thus-calculated overall voltage of the battery 10 (battery voltage) is in an overcharge condition in which it exceeds a predetermined first threshold, and whether or not the battery voltage is in an overdischarge condition in which it is less than a predetermined second threshold value, which is lower than the first threshold. Furthermore, the determination unit 22 determines, based on the temperature information obtained from the battery monitoring devices 30, whether or not the temperature of any one of the assembled batteries 11 is in an overtemperature condition in which it exceeds a predetermined temperature threshold. Thus, the determination unit 22 determines whether or not the voltage and the temperature of the battery 10 are abnormal based on the detection information received by the wireless communication unit 24.

After step S7, the battery ECU 20 determines, with respect to each of the assembled batteries 11, whether or not the variation between the inter-terminal voltages of the plurality of battery cells 12 is within a predetermined value (step S8). For example, based on wireless transmission data received from the battery monitoring devices 30 (data that contains detection information of the plurality of battery monitoring devices 30), it is determined whether or not, in any one of the assembled batteries 11, the difference in inter-terminal voltage between the battery cell 12 with the largest inter-terminal voltage and the battery cell 12 with the smallest inter-terminal voltage exceeds a predetermined value, and if, in any assembled battery 11, this difference exceeds the predetermined value (Yes in step S8), instruction information that contains a cell balance instruction is transmitted in step S9, the instruction being intended for to the battery monitoring device 30 to which this assembled battery 11 is assigned or all of the battery monitoring devices 30.

For example, when a cell balance instruction is given to all of the battery monitoring devices 30, instruction information that contains the cell balance instruction is wirelessly transmitted, in step S9, to the battery monitoring device 30 for which it is determined that communication therewith has been established in step S3 or S4. In each battery monitoring device 30, control shown in FIG. 5 is repeatedly performed, and thus the instruction information wirelessly transmitted in this way is transmitted to each battery monitoring device 30 in the same flow as that of the above-described instruction information (instruction information that contains a notification instruction). Upon receiving the instruction information that contains a notification instruction, each battery monitoring device 30 transmits the instruction information to the upper side in step S22, and then executes the processing in steps S29 and S30, and upon receiving the instruction information that contains a cell balance instruction, each battery monitoring device 30 transmits the instruction information to the upper side in step S22, and then executes the processing in steps S27 and S28.

The cell balance instruction refers to an instruction to instruct the battery monitoring device 30 to execute cell balance processing, and is, for example, a command specified by predetermined information.

As shown in FIG. 5, each battery monitoring device 30 determines, in step S27 of the processing shown in FIG. 5 that is repeated in short time intervals, whether or not a cell balance instruction has been given, and if a cell balance instruction is contained in the received instruction information (No in step S26 and "Yes" in step S27), the battery monitoring device 30 performs cell balance processing in step S28. Specifically, the battery monitoring device 30 to which a cell balance instruction was given causes its detection/adjustment circuit unit 36 to operate so that, of the plurality of battery cells 12 constituting the assembled battery 11 assigned to this battery monitoring device 30, the battery cells 12, other than the battery cell 12 with the lowest output voltage, discharge to bring their output voltages closer to the lowest output voltage. The discharge units 16 for causing the respective battery cells 12 to discharge are connected to the detection/adjustment circuit unit 36, and the control unit 40 controls operations of the discharge units 16 to equalize and bring the inter-terminal voltages of all of the battery cells 12 of the assigned assembled battery 11 into the same range.

Note that, when having performed the cell balance processing in step S28 in FIG. 5, the battery monitoring device 30 performs the above-described processing of step S29 again, and detects the inter-terminal voltages of the battery cells 12 and the temperature of the assembled battery 11 that are subjected to the cell balance processing in the assigned assembled battery 11. Then, processing in step S30 is executed, and the items of information detected in step S29 are transmitted as wireless transmission data. In this way, after cell balance processing is performed in each of the battery monitoring devices 30, the pieces of detection information generated by the battery monitoring devices 30 in step S29 are put together into wireless transmission data, and are to be wirelessly transmitted to the battery ECU 20.

When having transmitted the cell balance instruction in step S9 in FIG. 4, receiving wireless transmission data from the battery monitoring device 30 again, the battery ECU 20 performs the procedure from step S7 onwards again.

In the determination in step S8 in FIG. 4, if it is determined that, in all of the assembled batteries 11, the variations between the inter-terminal voltages of the plurality of battery cells 12 are within a predetermined value, the battery ECU 20 transmits a battery condition to the external ECU (power management ECU 120) in step S10. Specifically, the battery ECU 20 transmits, based on the last determination result in step S7, information that indicates whether or not the battery voltage is in the overcharge condition in which it exceeds the predetermined first threshold, information that indicates whether or not the battery voltage is in the overdischarge condition in which it is less than the second threshold value, information that indicates whether or not the temperature of any one of the assembled batteries 11 is in the overtemperature condition in which it exceeds a predetermined temperature threshold, and the like, to the power management ECU 120. Note that, in addition, various types of information such as SOC, SOH, or the internal resistance of the battery 10 may also be transmitted, for example.

Hereinafter, examples of effects of the present configuration will be described.

Since the battery monitoring device 30 can transmit detection information based on a detection result of the detection unit 50 (information indicating at least one of the voltage and the temperature of the battery 10) to another battery monitoring device 30, transmission of the detection information using the other battery monitoring device 30 is possible. Moreover, the characteristic information transmission using another battery monitoring device 30 in this way can be realized by wireless communication, and thus it is possible to effectively reduce the number of wires.

The battery monitoring device 30 includes a substrate portion 70 that is attached to the battery 10 directly or indirectly via another member. Also, at least the wireless communication unit 60 is mounted on the substrate portion 70.

According to the above-described configuration, since the substrate portion 70 can be arranged in the vicinity of the battery 10, further downsizing is possible. Even if the substrate portion 70 is arranged in the vicinity of the battery 10 in this way, it is possible to wirelessly transmit information to the outside, and thus the wiring design is not likely to be complicated.

The above-described battery monitoring system 1 includes the plurality of battery monitoring devices 30, and the battery ECU 20 (external control device) configured to receive information transmitted from the wireless communication unit 60 of any one of the plurality of battery monitoring devices 30.

According to the above-described configuration, it is possible to realize a system that can transmit detection information based on detection results in the battery monitoring devices 30 (information indicating at least one of the voltage and the temperature of the battery 10) to the battery ECU 20 (external control device) via communication, with a configuration in which the number of wires is reliably reduced.

The above-described battery monitoring system 1 includes the plurality of battery monitoring devices 30, namely, three or more battery monitoring devices 30. One of the plurality of battery monitoring devices 30 is defined as the topmost monitoring device 30A at the highest rank, another device is defined as the lowermost monitoring device 30D at the lowest rank, and devices other than the topmost monitoring device 30A and the lowermost monitoring device 30D are defined as the intermediate monitoring devices 30B and 30C. If a predetermined transmission condition is met, the topmost monitoring device 30A functions to take the battery monitoring device 30 at the next lower rank as a destination, and wirelessly transmit wireless transmission data that contains detection information generated by the topmost monitoring device 30A to this destination. The intermediate monitoring devices 30B and 30C each function to, when wireless transmission data is given to it through wireless transmission from the battery monitoring device 30 at the next higher rank, transmits new wireless transmission data obtained by detection information generated by itself to the given wireless transmission data, to the battery monitoring device 30 at the next lower rank. The lowermost monitoring device 30D functions to, when wireless transmission data is given to it through wireless transmission from the battery monitoring device 30 at the next higher rank, wirelessly transmit new wireless transmission data obtained by adding detection information generated by itself to the given wireless transmission data, to the battery ECU 20 (external control device).

According to this battery monitoring system 1, it is possible to define the order of transmission of information among a plurality of battery monitoring devices 30. Also, when detection information generated in the plurality of battery monitoring devices 30 are output to the outside, the detection information generated in the battery monitoring devices 30 can be collected in the order starting from the topmost monitoring device 30A, and the collected data can be wirelessly transmitted from the lowermost monitoring device 30D to the battery ECU 20 (external control device). When employing such a method, it is possible to perform communication between battery monitoring devices 30 and communication from the lowermost monitoring device 30D to the battery ECU 20 (external control device) via wireless communication, and thus the effect of reducing the number of wires can be significantly enhanced. Moreover, since detection information can be collected at the lowermost monitoring device 30D, and then can be transmitted from the lowermost monitoring device 30D to the battery ECU 20 (external control device), making it possible to reduce the load applied to the battery ECU 20 (external control device) compared to a configuration in which the battery ECU 20 (external control device) always communicates with all of the battery monitoring devices 30.

As shown in FIG. 6, when all of the battery monitoring devices 30 are in a communicable state, the battery ECU 20 (external control device) functions to wirelessly transmit instruction information that specifies a predetermined instruction to the lowermost monitoring device 30D. When data that contains the instruction specified by the instruction information (the instruction information itself or data obtained by processing the instruction information) is given through wireless transmission from the battery ECU 20 (external control device), the lowermost monitoring device 30D functions to take the battery monitoring device 30 (intermediate monitoring device 30C) at the next higher rank as a destination, and wirelessly transmit the data that contains the instruction specified by the instruction information to this destination. Each of the intermediate monitoring devices 30B and 30C functions to, if the data that contains the instruction specified by the instruction information is given to it through wireless transmission from the battery monitoring device 30 at the next lower rank, take the battery monitoring device 30 at the next higher rank as a destination, and wirelessly transmit the data that contains the instruction specified by the instruction information to this destination. Also, upon receiving the data that contains the instruction specified by the instruction information, each of the plurality of battery monitoring devices 30 functions to perform control that corresponds to the instruction specified by the instruction information.

According to the above-described configuration, it is possible to realize a battery monitoring system 1 in which each of the plurality of battery monitoring devices 30 can perform control that corresponds to an instruction from the battery ECU 20 (external control device), with a configuration in which the number of wires is reduced and the communication load applied to the battery ECU 20 (external control device) is suppressed.

As shown in FIG. 6, when all of the battery monitoring devices 30 are in the communicable state, the battery ECU 20 (external control device) functions to wirelessly transmit instruction information that contains a predetermined notification instruction to the lowermost monitoring device 30D. Each of the intermediate monitoring devices 30B and 30C functions to, if data that contains the notification instruction is given to it through wireless transmission from the battery monitoring device 30 at the next lower rank, take the battery monitoring device 30 at the next higher rank as a destination, and wirelessly transmit the data that contains the notification instruction to this destination. The topmost monitoring device 30A functions to, if data that contains the notification instruction is given to it through wireless transmission from the battery monitoring device 30 (intermediate monitoring device 30B) at the next lower rank, take the battery monitoring device 30 (intermediate monitoring device 30B) at the next lower rank as a destination, and wirelessly transmit wireless transmission data that contains detection information generated in the topmost monitoring device 30A to this destination. Each of the intermediate monitoring devices 30B and 30C functions to, if data that contains the notification instruction is given and the wireless transmission data is given to it through wireless transmission from the battery monitoring device 30 at the next higher rank, wirelessly transmit new wireless transmission data obtained by adding the detection information generated by itself to the given wireless transmission data, to the battery monitoring device 30 at the next lower rank. The lowermost monitoring device 30D functions to, if data that contains the notification instruction is given to it through wireless transmission from the battery ECU 20 (external control device) and wireless transmission data is given to it through wireless transmission from the battery monitoring device 30 (intermediate monitoring device 30C) at the next higher rank, wirelessly transmit new wireless transmission data obtained by adding detection information generated by itself to the given wireless transmission data, to the battery ECU 20 (external control device).

According to the above-described configuration, it is possible to realize a battery monitoring system 1 in which each of the plurality of battery monitoring devices 30 can transmit detection information (detection information indicating at least one of the voltage and the temperature of the battery 10) in accordance with a notification instruction from the battery ECU 20 (external control device), with a configuration in which the number of wires is reduced and the communication load applied to the battery ECU 20 (external control device) is suppressed.

The detection unit 50 of the battery monitoring device 30 is configured to detect voltage information that specifies inter-terminal voltages of the battery cells 12, the plurality of battery cells 12 being connected to each other to constitute the battery 10. When the lowermost monitoring device 30D is in a communicable state, the battery ECU 20 (external control device) functions to wirelessly transmit instruction information that contains a predetermined cell balance instruction to the lowermost monitoring device 30D. If data that contains the cell balance instruction is given through wireless transmission from the battery ECU 20 (external control device), the lowermost monitoring device 30D functions to take the battery monitoring device 30 (intermediate monitoring device 30C) at the next higher rank as a destination, and wirelessly transmit the data that contains the cell balance instruction to this destination. Each of the intermediate monitoring devices 30B and 30C functions to, if data that contains the cell balance instruction is given to it through wireless transmission from the battery monitoring device 30 at the next lower rank, take the battery monitoring device 30 at the next higher rank as a destination, and wirelessly transmit data that contains the cell balance instruction to this destination. Upon receiving the data that contains a cell balance instruction, each of the plurality of battery monitoring devices 30 functions to cause the plurality of battery cells 12 to charge or discharge so that the inter-terminal voltages of the battery cells 12 are equalized, based on detection results of its detection unit 50.

According to the above-described configuration, it is possible to realize a battery monitoring system 1 in which each of the plurality of battery monitoring devices 30 can perform cell balance control in accordance with a cell balance instruction from the battery ECU 20 (external control device), with a configuration in which the number of wires is reduced and the communication load applied to the battery ECU 20 (external control device) is suppressed.

Other Embodiments

The present disclosure is not limited to the embodiment described with reference to the description above and the drawings, and the technical scope of the present disclosure encompasses, for example, the following embodiments. Furthermore, the above-described embodiment and below-described embodiments may be combined with each other unless they contradict each other.

In Embodiment 1, an example of cell balance processing is taken, but the cell balance processing may also be performed using a well-known method. In the example of Embodiment 1, individual battery cells 12 are configured to be able to discharge, and their inter-terminal voltages are equalized by controlling discharge of the battery cells 12, but a configuration is also possible in which individual battery cells 12 are able to discharge and charge, and their inter-terminal voltages are equalized by controlling discharge and charge of the battery cells 12.

In Embodiment 1, one battery monitoring device 30 is assigned to one assembled battery 11, but one battery monitoring device 30 may also be assigned to a plurality of assembled batteries 11. Alternatively, one assembled battery 11 may also be divided into a plurality of areas, and one battery monitoring device 30 may be assigned to each of the areas.

In Embodiment 1, an example is taken in which the substrate portion 70 is directly fixed to the battery 10, but the substrate portion 70 may also be fixed indirectly to the battery 10 via another member.

In Embodiment 1, the battery ECU 20 is taken as an example of the external control device, but the external control device is not limited to the battery ECU 20 as long as it is an onboard electronic control device arranged outside of the battery monitoring device 30.

In Embodiment 1, an example is taken in which a battery monitoring device 30 is assigned to an assembled battery 11 including an assembly of a plurality of battery cells 12, but a configuration is also possible in which the battery monitoring device 30 is attached to one battery (a single battery).

In Embodiment 1, an example is taken in which, when each of the battery monitoring devices 30 performs the control shown in FIG. 5, inter-terminal voltages of the battery cells 12 constituting the assembled battery 11 or the temperature of the assembled battery 11 is detected in step S29, but it is also possible to calculate the overall voltage, internal resistance, capacity, or degradation level of the assembled battery 11, or the internal resistances, capacities, degradation levels, or the like of the battery cells 12, and wirelessly transmit information indicating them in step S30.

In Embodiment 1, an example of cell balance processing is taken in which, if it is determined as "Yes" in step S8 in FIG. 4, instruction information that contains a cell balance instruction is transmitted in step S9, and cell balance processing is executed in all of the battery monitoring devices 30, but a configuration is also possible in which a cell balance instruction is given only to the battery monitoring device 30 assigned to the assembled battery 11 in which the variation in inter-terminal voltages of the plurality of battery cells 12 is not within a predetermined value. For example, when the battery ECU 20 transmits instruction information in which the unique ID that specifies this battery monitoring device 30 and the cell balance instruction are associated with each other, and on the battery monitoring device 30 side, cell balance processing is executed if the cell balance instruction associated with its own unique ID is given.

In Embodiment 1, an example of a configuration is taken in which, when wirelessly communicating with any one of the battery monitoring devices 30, the battery ECU 20 directly performs wireless communication therewith without going through another device, but when wirelessly communicating with any one of the battery monitoring devices 30, the battery ECU 20 may indirectly perform wireless communication therewith via a relay device. For example, instruction information wirelessly transmitted from the battery ECU 20 may be first received by the relay device, and then the instruction information transmitted from the relay device may be received by any one of the battery monitoring devices 30. Furthermore, wireless transmission data wirelessly transmitted from any one of the battery monitoring device 30 may be first received by the relay device, and then the wireless transmission data transmitted from the relay device may be received by the battery ECU 20. Alternatively, as wireless communication between the battery ECU 20 and a battery monitoring device 30, both direct wireless communication and indirect wireless communication via the relay device may be conceivable.

The invention claimed is:

1. A vehicular battery monitoring system comprising:
three or more vehicular battery monitoring devices for monitoring a battery installed in a vehicle; and
an external control device configured to receive information transmitted from any one of the plurality of battery monitoring devices,
wherein each of the vehicular battery monitoring devices includes:
a detection unit configured to detect at least one of a voltage at a predetermined position of the battery and a temperature of the battery; and
a wireless communication unit configured to transmit, using a wireless communication method, detection information that indicates at least one of the voltage and the temperature of the battery based on a detection result of the detection unit, at least to another battery monitoring device provided in the vehicle,
the external control device is configured to receive information transmitted from the wireless communication unit of any one of the plurality of battery monitoring devices,
one of these battery monitoring devices is defined as a topmost monitoring device at the highest rank, another device is defined as a lowermost monitoring device at the lowest rank, and any monitoring device other than the topmost monitoring device and the lowermost monitoring device is defined as an intermediate monitoring device, and
wherein, if a predetermined transmission condition is met, the topmost monitoring device is configured to take the battery monitoring device at the next lower rank as a destination, and wirelessly transmit wireless transmission data that contains the detection information generated by the topmost monitoring device to this destination,
any intermediate monitoring device is configured to, if wireless transmission data is given to it through wireless transmission from the battery monitoring device at the next higher rank, transmit new wireless transmission data obtained by adding the detection information generated by itself to the given wireless transmission data, to the battery monitoring device at the next lower rank, and
the lowermost monitoring device is configured to, if wireless transmission data is given to it through wireless transmission from the battery monitoring device at the next higher rank, wirelessly transmit new wireless transmission data obtained by adding the detection information generated by itself to the given wireless transmission data, to the external control device, and
wherein the external control device is configured to wirelessly transmit instruction information that specifies a predetermined instruction to the lowermost monitoring device,
if data that contains the instruction specified by the instruction information is given through wireless transmission from the external control device, the lowermost monitoring device is configured to take the battery monitoring device at the next higher rank as a destination, and wirelessly transmit the data that contains the instruction specified by the instruction information to this destination,
any intermediate monitoring device is configured to, if data that contains the instruction specified by the instruction information is given to it through wireless transmission from the battery monitoring device at the next lower rank, take the battery monitoring device at the next higher rank as a destination, and wirelessly transmit the data that contains the instruction specified by the instruction information to this destination,
upon receiving the data that contains the instruction specified by the instruction information, each of the plurality of battery monitoring devices performs control that corresponds to the instruction specified by the instruction information, and
if no communication is established despite a trial of communication with the lowermost monitoring device, the external control device takes the battery monitoring device at the lowest rank of the plurality of battery monitoring devices excluding the lowermost monitoring device as a destination, and transmits the instruction information to this destination.

2. The vehicular battery monitoring system according to claim 1, further comprising:
a substrate portion configured to be attached to the battery directly or indirectly via another member,
wherein at least the wireless communication unit is mounted on the substrate portion.

3. The vehicular battery monitoring system according to claim 2,
wherein the external control device is configured to wirelessly transmit the instruction information that contains a predetermined notification instruction to the lowermost monitoring device,
any intermediate monitoring device is configured to, if data that contains the notification instruction is given to it through wireless transmission from the battery monitoring device at the next lower rank, take the battery monitoring device at the next higher rank as a destination, and wirelessly transmit the data that contains the notification instruction to this destination,
the topmost monitoring device is configured to, if the data that contains the notification instruction is given to it through wireless transmission from the battery monitoring device at the next lower rank, take the battery monitoring device at the next lower rank as a destination, and wirelessly transmit wireless transmission data that contains the detection information generated by the topmost monitoring device to this destination,
any intermediate monitoring device is configured to, if the data that contains the notification instruction is given and wireless transmission data is given to it through wireless transmission from the battery monitoring device at the next higher rank, wirelessly transmit new wireless transmission data obtained by adding the detection information generated by itself to the given wireless transmission data, to the battery monitoring device at the next lower rank, and
the lowermost monitoring device wirelessly transmits, if the data that contains the notification instruction is given through wireless transmission from the external control device and wireless transmission data is given to it through wireless transmission from the battery monitoring device at the next higher rank, new wireless transmission data obtained by adding the detection information generated by itself to the given wireless transmission data, to the external control device.

4. The vehicular battery monitoring system according to claim 2,
wherein the detection unit of each of the battery monitoring devices is configured to detect voltage information that specifies inter-terminal voltages of a plurality of battery cells, the plurality of battery cells being connected to each other to constitute the battery,
the external control device is configured to wirelessly transmit the instruction information that contains a predetermined cell balance instruction to the lowermost monitoring device,
if data that contains the cell balance instruction is given through wireless transmission from the external control device, the lowermost monitoring device is configured to take the battery monitoring device at the next higher rank as a destination, and wirelessly transmit the data that contains the cell balance instruction to this destination,
any intermediate monitoring device is configured to, if data that contains the cell balance instruction is given to it through wireless transmission from the battery monitoring device at the next lower rank, take the battery monitoring device at the next higher rank as a destination, and wirelessly transmit the data that contains the cell balance instruction to this destination, and
upon receiving data that contains the cell balance instruction, each of the battery monitoring devices causes the plurality of battery cells to charge or discharge so that the inter-terminal voltages of the battery cells are equalized based on detection results of the detection unit of the corresponding battery monitoring device.

5. The vehicular battery monitoring system according to claim 1,
wherein the external control device is configured to wirelessly transmit the instruction information that contains a predetermined notification instruction to the lowermost monitoring device,
any intermediate monitoring device is configured to, if data that contains the notification instruction is given to it through wireless transmission from the battery monitoring device at the next lower rank, take the battery monitoring device at the next higher rank as a destination, and wirelessly transmit the data that contains the notification instruction to this destination,
the topmost monitoring device is configured to, if the data that contains the notification instruction is given to it through wireless transmission from the battery monitoring device at the next lower rank, take the battery monitoring device at the next lower rank as a destination, and wirelessly transmit wireless transmission data that contains the detection information generated by the topmost monitoring device to this destination,
any intermediate monitoring device is configured to, if the data that contains the notification instruction is given and wireless transmission data is given to it through wireless transmission from the battery monitoring device at the next higher rank, wirelessly transmit new wireless transmission data obtained by adding the detection information generated by itself to the given wireless transmission data, to the battery monitoring device at the next lower rank, and
the lowermost monitoring device wirelessly transmits, if the data that contains the notification instruction is given through wireless transmission from the external control device and wireless transmission data is given to it through wireless transmission from the battery monitoring device at the next higher rank, new wireless transmission data obtained by adding the detection information generated by itself to the given wireless transmission data, to the external control device.

6. The vehicular battery monitoring system according to claim 5,
wherein the detection unit of each of the battery monitoring devices is configured to detect voltage information that specifies inter-terminal voltages of a plurality of battery cells, the plurality of battery cells being connected to each other to constitute the battery,
the external control device is configured to wirelessly transmit the instruction information that contains a predetermined cell balance instruction to the lowermost monitoring device,
if data that contains the cell balance instruction is given through wireless transmission from the external control device, the lowermost monitoring device is configured to take the battery monitoring device at the next higher rank as a destination, and wirelessly transmit the data that contains the cell balance instruction to this destination, any intermediate monitoring device is configured to, if data that contains the cell balance instruction is given to it through wireless transmission from the battery monitoring device at the next lower rank, take the battery monitoring device at the next higher rank as a destination, and wirelessly transmit the data that contains the cell balance instruction to this destination, and upon receiving data that contains the cell balance instruction, each of the battery monitoring devices causes the plurality of battery cells to charge or discharge so that the inter-terminal voltages of the battery cells are equalized based on detection results of the detection unit of the corresponding battery monitoring device.

7. The vehicular battery monitoring system according to claim 1, wherein the detection unit of each of the battery monitoring devices is configured to detect voltage information that specifies inter-terminal voltages of a plurality of battery cells, the plurality of battery cells being connected to each other to constitute the battery, the external control device is configured to wirelessly transmit the instruction information that contains a predetermined cell balance instruction to the lowermost monitoring device, if data that contains the cell balance instruction is given through wireless transmission from the external control device, the lowermost monitoring device is configured to take the battery monitoring device at the next higher rank as a destination, and wirelessly transmit the data that contains the cell balance instruction to this destination, any intermediate monitoring device is configured to, if data that contains the cell balance instruction is given to it through wireless transmission from the battery monitoring device at the next lower rank, take the battery monitoring device at the next higher rank as a destination, and wirelessly transmit the data that contains the cell balance instruction to this destination, and upon receiving data that contains the cell balance instruction, each of the battery monitoring devices causes the plurality of battery cells to charge or discharge so that the inter-terminal voltages of the battery cells are equalized based on detection results of the detection unit of the corresponding battery monitoring device.

\* \* \* \* \*